United States Patent
Hung et al.

(10) Patent No.: US 9,208,842 B2
(45) Date of Patent: Dec. 8, 2015

(54) METHOD AND SYSTEM FOR OPERATING MEMORY

(71) Applicant: Macronix International Co., Ltd., Hsinchu (TW)

(72) Inventors: Chun-Hsiung Hung, Hsinchu (TW); Nai-Ping Kuo, Hsinchu (TW); Ken-Hui Chen, Hsinchu (TW); Kuen-Long Chang, Taipei (TW); Yu-Chen Wang, Kaohsiung (TW); Chin-Hung Chang, Tainan (TW); Chia-Feng Cheng, Changhua (TW); Min-Hsiung Meng, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 70 days.

(21) Appl. No.: 14/162,854

(22) Filed: Jan. 24, 2014

(65) Prior Publication Data

US 2015/0213864 A1   Jul. 30, 2015

(51) Int. Cl.
*G11C 8/00* (2006.01)
*G11C 8/18* (2006.01)

(52) U.S. Cl.
CPC ........................................ *G11C 8/18* (2013.01)

(58) Field of Classification Search
CPC ................................ G11C 8/04; G11C 7/1018
USPC ............................................. 365/236, 185.18
See application file for complete search history.

(56) References Cited

U.S. PATENT DOCUMENTS

2008/0183952 A1*   7/2008   Rikitake ................. 711/103

FOREIGN PATENT DOCUMENTS

TW   201314227   4/2013
TW   201329762   7/2013

OTHER PUBLICATIONS

English Abstract translation of TW201314227 (Published Apr. 1, 2013).
English Abstract translation of TW201329762 (Published Jul. 16, 2013).

* cited by examiner

*Primary Examiner* — Huan Hoang
(74) *Attorney, Agent, or Firm* — McClure, Qualey & Rodack, LLP

(57) ABSTRACT

A method and a system for operating a memory are provided. The memory includes a plurality of memory cells which are configured to store data. The method includes the following steps. A counting number recorded in a counter is counted by 1, if the memory is written. The memory is set as a frequently using device, if the counting number recoded in the counter reaches a predetermined value.

20 Claims, 3 Drawing Sheets

METHOD AND SYSTEM FOR OPERATING MEMORY

BACKGROUND

1. Technical Field

The disclosure relates in general to a method and a system, and more particularly to a method and a system for operating a memory.

2. Description of the Related Art

In flash memory devices, data is stored by trapping charge that establishes a cell threshold in memory cells. By sensing the cell threshold, data values can be read. However, as the memory cell sizes are reduced, charge retention, and therefore data retention, may suffer. In non-volatile memory devices configured to store data for a long period of time and through power-on/off events, data retention is an important performance factor.

It is desirable to provide technologies to improve non-volatile memory performance, and, in general, to improve data retention for integrated circuit memory.

SUMMARY

The disclosure is directed to a method and a system for operating a memory. Whether a memory is a frequently using device is determined. Thus, the memory which is not the frequently using device can be identified, and performed a retention checking procedure and a retention writing procedure during a stand-by mode.

According to a first aspect of the present disclosure, a method for operating a memory is provided. The memory includes a plurality of memory cells which are configured to store data. The method includes the following steps. A counting number recorded in a counter is counted by 1, if the memory is written. The memory is set as a frequently using device, if the counting number recoded in the counter reaches a predetermined value.

According to a second aspect of the present disclosure, a system for operating a memory is provided. The memory includes a plurality of memory cells which are configured to store data. The system includes a counter, and a setting circuit. The counter is used for recording a counting number. The counting number recorded in the counter is counted by 1, if the memory is written. The setting circuit is used for setting the memory as a frequently using device, if the counting number recorded in the counter reaches a predetermined value.

The above and other aspects of the disclosure will become better understood with regard to the following detailed description of the non-limiting embodiment(s). The following description is made with reference to the accompanying drawings.

DETAILED DESCRIPTION

Figure 1:
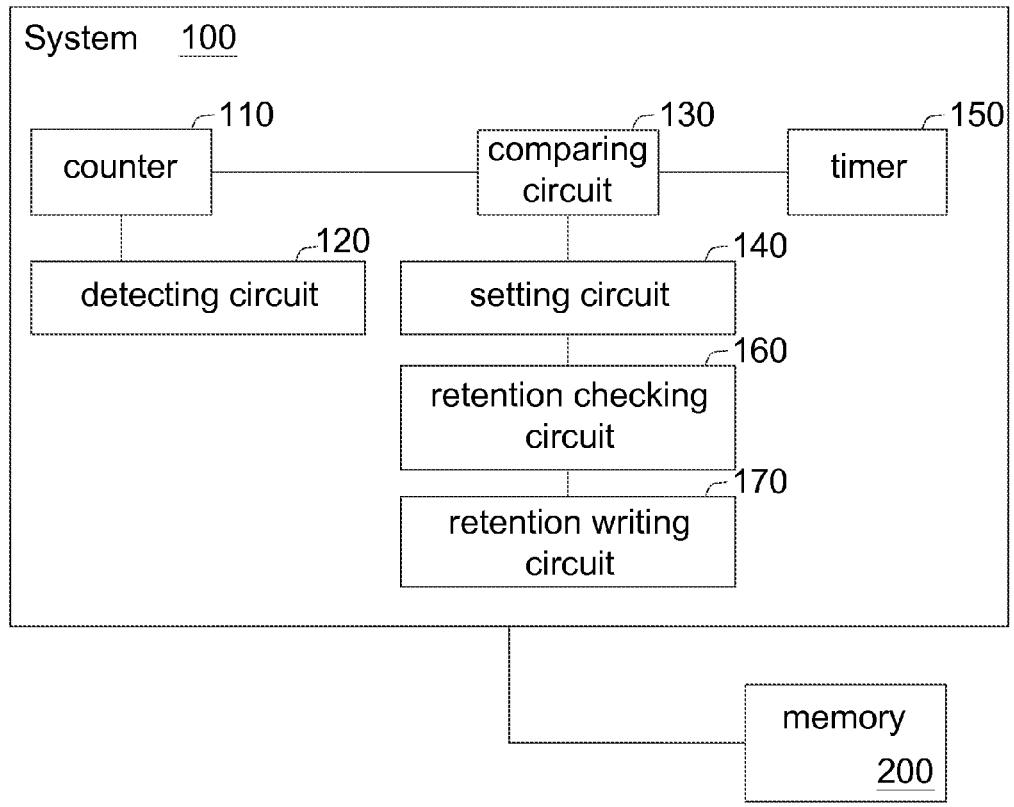
FIG. 1 shows a system for operating a memory.

Preferred embodiments are disclosed below for elaborating the invention. Whether a memory is a frequently using device is determined. Thus, the memory which is not the frequently using device can be identified, and performed a retention checking procedure and a retention writing procedure during a stand-by mode. However, the following embodiments are for the purpose of elaboration only, not for limiting the scope of protection of the invention. Besides, secondary elements are omitted in the following embodiments to highlight the technical features of the invention.

References will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete process flow for the operation of non-volatile memory devices. The present invention may be practiced in conjunction with various operating methods and other techniques that are conventionally used in the art, and only so much of the commonly practiced steps are included herein as are necessary to provide an understanding of the present invention. The present invention has applicability in the field of semiconductor devices and processes in general. For illustrative purposes, however, the following description pertains to a non-volatile memory device and a related method.

Figure 2:
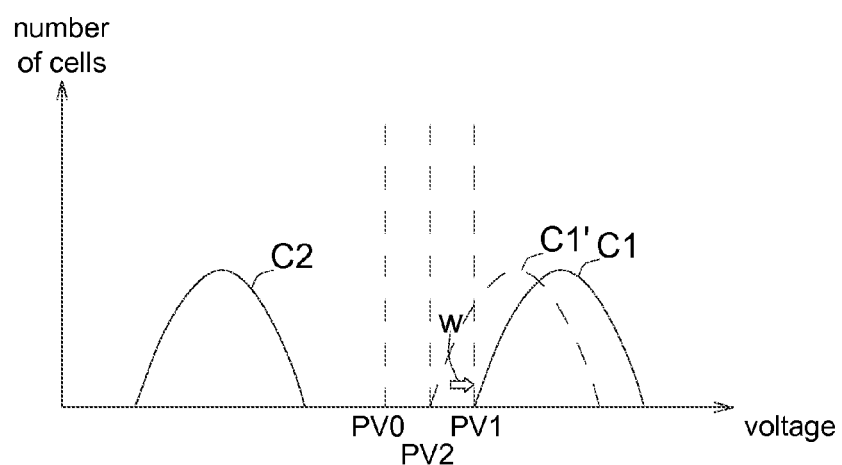
FIG. 2 is a simplified diagram showing threshold voltage distributions of the memory cells.

Please referring to FIG. 1, a system 100 for operating a memory 200 is shown. The memory 200 includes a plurality of memory cells. Please referring to FIG. 2, FIG. 2 is a simplified diagram showing threshold voltage distributions of the memory cells. The vertical axis represents the number of cells having a particular threshold voltage (i.e. word line voltage at which the memory cell turns on sufficient for the sensing circuits), and the horizontal axis represents the word line voltage for the corresponding sample. The memory cells are configured to store data values by using two threshold states including a high threshold state and a low threshold state. A high threshold distribution C1 corresponds to the memory cells at the high threshold state, and a low threshold distribution C2 corresponds to the memory cells at the low threshold state. In a reading mode, a read voltage is applied at a voltage level PV0 between the high threshold distribution C1 and the low threshold distribution C2. The range between the maximum threshold voltage of the low threshold distribution C2 and the minimum threshold voltage of the high threshold distribution C1 represents a margin for successful reading of the memory cells.

In the design of a floating gate and a charge trapping flash memory, as the technology progressively scales down in size, data retention may suffer because of charge leakage. Also, data retention can be an issue for other memory types. Data retention can suffer if the threshold voltages of the memory cells drift during the life of the memory cells. This phenomenon is represented by the shifted high threshold distribution C1' shown in FIG. 2, where the memory cells that use trapped charge to set the threshold voltage may lose charge over time. This shift in the threshold voltage reduces the margin, and may cause reliability problems.

As described herein, a retention checking procedure includes applying a read voltage, such as at the voltage level PV1, to detect the memory cells which are suffering a charge loss or another condition that leads to a reduction in their threshold voltage.

Then, a retention writing procedure represented by an arrow W can increase the threshold voltage of the memory cells. The retention writing procedure can be the same as a normal program sequence used in response to a program command. Alternatively, the retention writing procedure can be different from the normal program sequence. For example, the retention writing procedure may employ different voltages and/or different pulse widths than the normal program sequence. Also, the retention writing procedure may skip some steps used in normal program sequences.

Please referring to FIG. 1, the system 100 comprises a counter 110, a detecting circuit 120, a comparing circuit 130, a setting circuit 140, a timer 150, a retention checking circuit 160 and a retention writing circuit 170. The counter 110 and the timer 150 are used for recording data. For example, each of the counter 110 and the timer 150 can be a register, a memory or a hard disk. The detecting circuit 120, the comparing circuit 130, the setting circuit 140, the retention checking circuit 160 and the retention writing circuit 170 are used for performing varied calculating procedures, controlling procedures or determining procedures. For example, each of the detecting circuit 120, the comparing circuit 130, the setting circuit 140, the retention checking circuit 160 and the retention writing circuit 170 can be a chip, a circuit board or a storage media storing a plurality of program codes.

Figure 3:
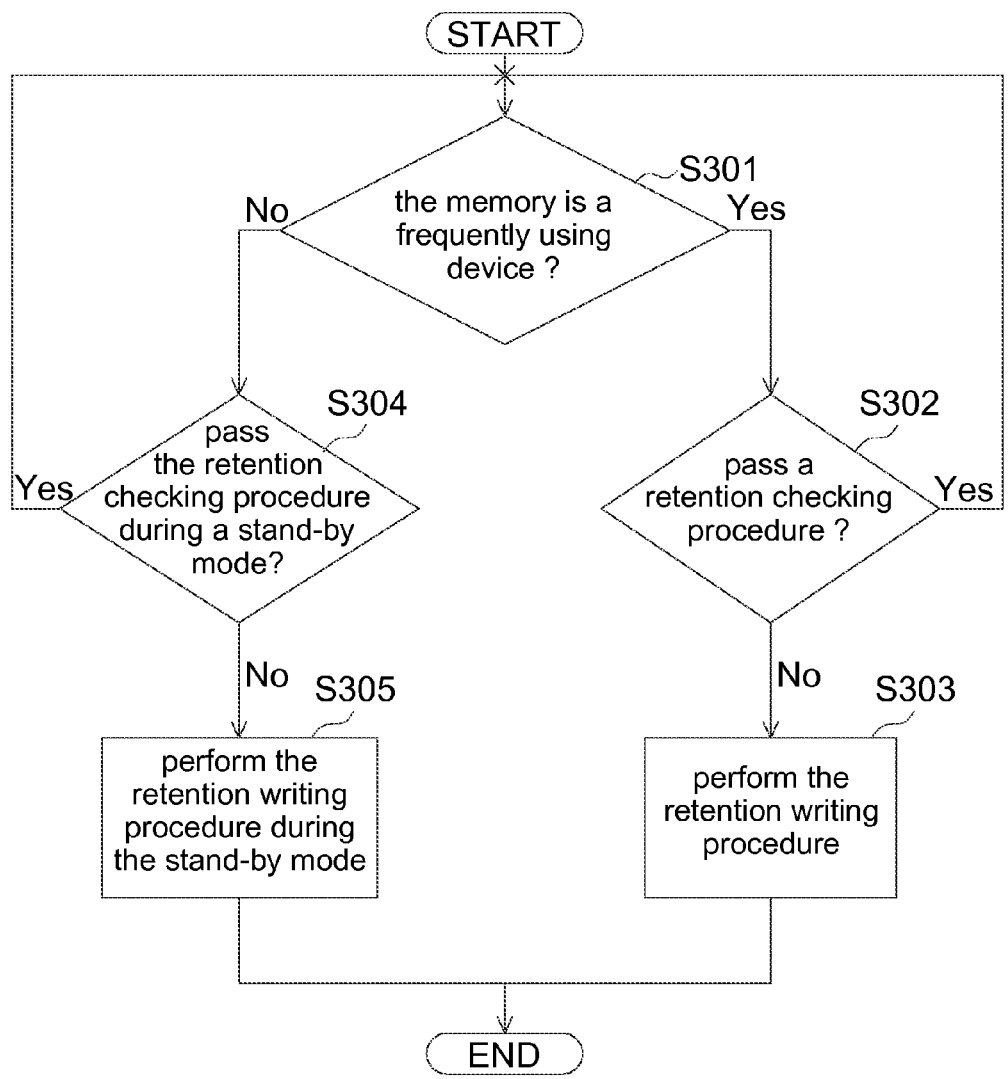
FIG. 3 shows a flowchart of a method for operating the memory.

Please referring to FIG. 3, a flowchart of a method for operating the memory 200 is shown. In step S301, whether the memory 200 is a frequently using device is determined. When one memory is frequently written, then this memory is defined as the frequently using device. If the memory 200 is the frequently using device, then the process proceeds to step S302; if the memory 200 is not the frequently using device, then the process proceeds to step S304.

In step S302, the retention checking circuit 160 performs the retention checking procedure on the memory 200. The step S302 can be performed during a writing mode or a stand-by mode. The writing mode includes erasing and programming. For example, the retention checking procedure can be performed before erasing or programming the memory 200 during the writing mode. If the memory 200 does not pass the retention checking procedure, then the process proceeds to step S303; if the memory 200 passes the retention checking procedure, then the process goes back to step S301.

In step S303, the retention writing circuit 170 performs the retention writing procedure on the memory 200. For example, the retention writing procedure can be performed before writing the memory 200. In step S302 and S303, because the memory 200 is the frequently using device, the memory 200 is frequently at the writing mode. The retention checking procedure and the retention writing procedure can be preformed frequently, if they are set to be preformed before writing the memory 200.

In step S304, the retention checking circuit 160 performs the retention checking procedure on the memory 200 during the stand-by mode. If the memory 200 does not pass the retention checking procedure, then the process proceeds to step S305; if the memory 200 passes the retention checking procedure, then the process goes back to step S301.

In step S305, the retention writing circuit 170 performs the retention writing procedure on the memory 200 during the stand-by mode. In step S304 and S305, because the memory 200 is not the frequently using device, the memory 200 is usually at the stand-by mode. The retention checking procedure and the retention writing procedure must be preformed at the stand-by mode every once in a while.

Figure 4:
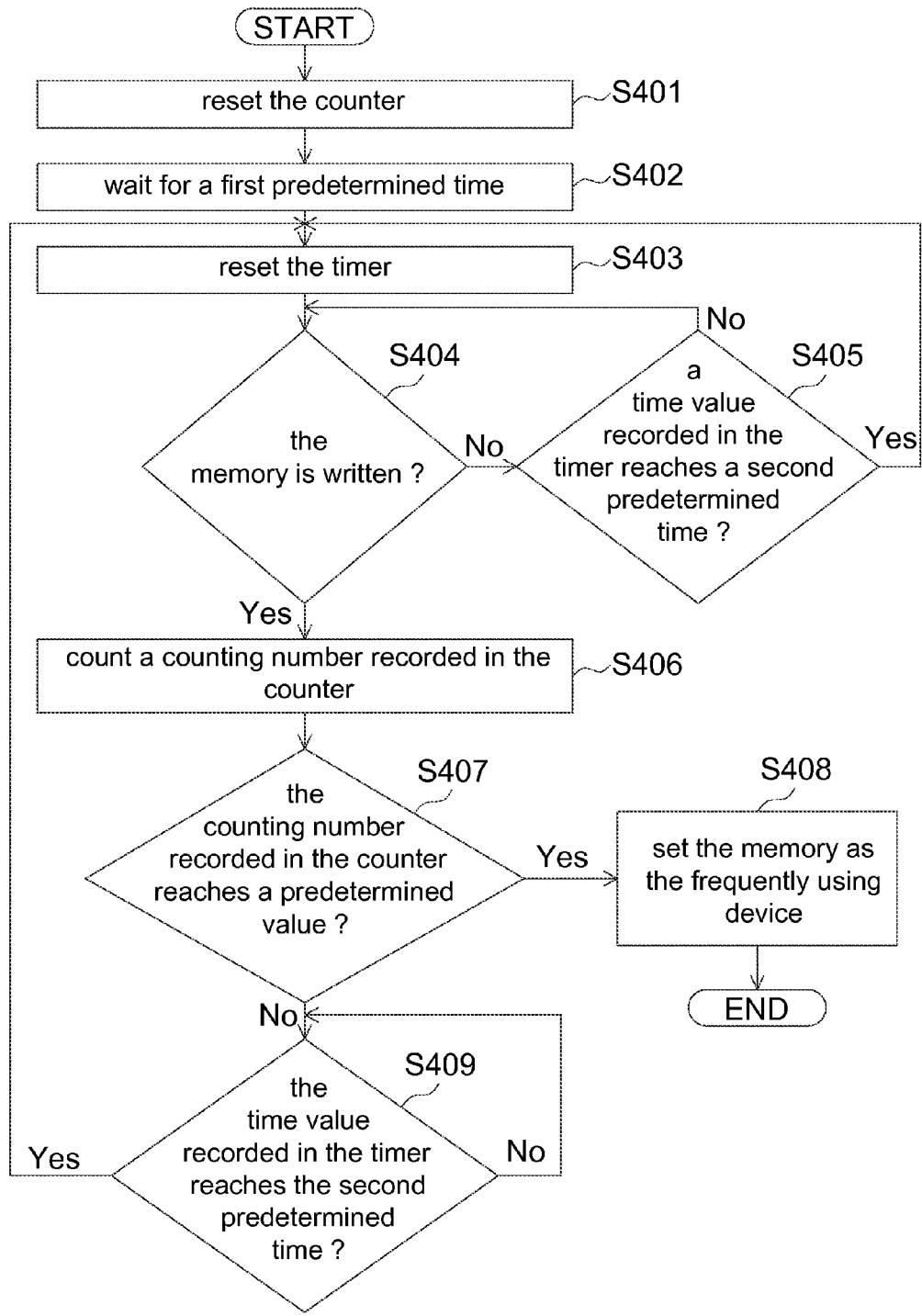
FIG. 4 shows a flowchart of the detail of the step S301 in FIG. 3.

Base on above, it is needed to determine whether the memory 200 is the frequently using device in step S301. Please referring to FIG. 4, a flowchart of the detail of the step S301 in FIG. 3 is shown.

In S401, the counter 110 is reset. For example, a counting number recorded in the counter 110 is set to be "0."

In step S402, the system 100 is waited for a first predetermined time. For example, the first predetermined time is half of an hour. At the beginning of operating the memory 200, some testing procedures may be performed for a period of time. Those testing procedures should not be deemed as a writing procedure. Therefore, the system 100 is waited for the first predetermined time to ignore those testing procedures.

In step S403, the timer 150 is reset. For example, a time value recorded in the timer 150 is set to be "0 sec."

In step S404, whether the memory 200 is written is determined by the detecting circuit 120. If the memory 200 is not written, then the process proceeds to step S405; if the memory 200 is written, then the process proceeds to step S406. For example, the writing procedure includes an erasing procedure and a programming procedure.

In step S405, whether the time value recorded in the timer 150 reaches a second predetermined time is determined by the comparing circuit 130. For example, the second predetermined time is half of an hour. If the time value recorded in the timer 150 reaches the second predetermined time, then the process goes back to step S403 to reset the timer 150; if the time value recorded in the timer 150 does not reach the second predetermined time, then the process goes back to step S404 to determine whether the memory 200 is written again until the memory 200 is written.

In step S406, the counting number recorded in the counter 110 is counted by 1. For example, the counting number can be increased or decrease by 1. By performing step S403 to S406, once the memory 200 is written during the second predetermined time, the counting number will be counted by 1.

In step S407, whether the counting number recorded in the counter 110 reaches a predetermined value is determined by the comparing circuit 130. The predetermined value is a natural number. For example, the predetermined value is 1. In other embodiment, the predetermined value can be equal to or larger than 2. If the counting number reaches the predetermined value, then the process proceeds to step S408; if the counting number does not reach the predetermined value, then the process proceeds to the step S409.

In step S408, the memory 200 is set as the frequently using device by the setting circuit 140. That is to say, if the retention checking procedure and the retention writing procedure is set to be performed during the writing mode, then this memory 200 will be performed the retention checking procedure and the retention writing procedure during the writing mode automatically.

In step S409, whether the time value recorded in the timer 150 reaches the second predetermined time is determined by the comparing circuit 130. If the time value recorded in the timer 150 reaches the second predetermined time then the process goes back to step S403 to reset the timer 150 and determine whether the memory 200 is written again; if the time value recorded in the timer 150 does not reach the second predetermined time then the process goes back to step S409 until the time value reaches the second predetermined time. That is to say, during one second predetermined time, the counting number will be counted by 1 for one time only, even if the memory 200 is written several times during one second predetermined time.

Base on above, if the process proceeds to the step S408, then the memory 200 is the frequently using device; if the process does not proceed to the step S408, then the memory 200 is not the frequently using device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a memory, wherein the memory includes a plurality of memory cells which are configured to store data, and the method comprises:
   counting a counting number recorded in a counter by 1, if the memory is written during a time interval; and
   setting the memory as a frequently using device, if the counting number recoded in the counter reaches a predetermined value.

2. The method according to claim 1, wherein in the step of counting the counting number recorded in the counter, the counting number is increased or decreased, if the memory is erased or programmed.

3. The method according to claim 1, wherein the predetermined value is a natural number.

4. The method according to claim 1, further comprising:
   resetting a counter before performing the step of counting the counting number.

5. The method according to claim 4, wherein after the step of resetting the counter, the method further comprises:
   waiting for a first predetermined time.

6. The method according to claim 5, further comprising:
   determining whether the memory is written;
   determining whether a time value recorded in a timer reaches a second predetermined time, if the memory is not written; and
   resetting the timer, if the time value recorded in the timer reaches the second predetermined time and the memory is not written.

7. The method according to claim 6, further comprising:
   determining whether the time value recorded in the timer reaches the second predetermined time, if the counting number recorded in the counter does not reach the predetermined value; and
   resetting the timer, if the time value recorded in the timer reaches the second predetermined time and the counting number recorded in the counter does not reach the predetermined value;
   wherein after the step of resetting the timer is performed, the method proceeds to the step of determining whether the memory is written.

8. The method according to claim 6, wherein the second predetermined time is half of an hour.

9. The method according to claim 1, further comprising:
   performing a retention checking procedure, if the memory is the frequently using device; and
   performing a retention writing procedure if the memory does not pass the retention checking procedure.

10. The method according to claim 1, further comprising:
    performing a retention checking procedure during a standby mode, if the memory is not the frequently using device; and
    performing a retention writing procedure if the memory does not pass the retention checking procedure.

11. A system for operating a memory, wherein the memory includes a plurality of memory cells, and the system comprises:
    a counter, used for recording a counting number;
    the counting number recorded in the counter is counted by 1, if the memory is written during a time interval; and
    a setting circuit, used for setting the memory as a frequently using device, if the counting number recorded in the counter reaches a predetermined value.

12. The system according to claim 11, wherein the counting number recorded in the counter is counted by 1, if the memory is erased or programmed.

13. The system according to claim 11, wherein the predetermined value is a natural number.

14. The system according to claim 11, wherein the system is waited for a first predetermined time after the counter is reset.

15. The system according to claim 14, further comprising:
    a comparing circuit, used for determining whether the counting number recorded in the counter reaches the predetermined value.

16. The system according to claim 15, further comprising:
    a timer, wherein the comparing circuit is further used for determining whether a time value recorded in the timer reaches a second predetermined time, if the memory is not written; and the timer is reset if the time value recorded in the timer reaches the second predetermined time.

17. The system according to claim 16, wherein the comparing circuit is further used for determining whether the time value recorded in the timer reaches the second predetermined time, if the counting number recorded in the counter does not reach the predetermined value; the timer is reset, if the time value recorded in the timer reaches the second predetermined time and the counting number recorded in the counter does not reach the predetermined value.

18. The system according to claim 16, wherein the second predetermined time is half of an hour.

19. The system according to claim 11, further comprising:
    a retention checking circuit, used for performing a retention checking procedure, if the memory is the frequently using device; and a retention writing circuit, used for performing a retention writing procedure if the memory does not pass the retention checking procedure.

20. The system according to claim 11, further comprising:
a retention checking circuit, used for performing a retention checking procedure during a stand-by mode, if the memory is not the frequently using device; and
a retention writing circuit, used for performing a retention writing procedure if the memory does not pass the retention checking procedure.

\* \* \* \* \*